United States Patent
Jain

(10) Patent No.: US 7,879,678 B2
(45) Date of Patent: Feb. 1, 2011

(54) METHODS OF ENHANCING PERFORMANCE OF FIELD-EFFECT TRANSISTORS AND FIELD-EFFECT TRANSISTORS MADE THEREBY

(75) Inventor: Ajaykumar R. Jain, San Carlos, CA (US)

(73) Assignee: Versatilis LLC, Shelburne, VT (US)

( * ) Notice: Subject to any disclaimer, the term of this patent is extended or adjusted under 35 U.S.C. 154(b) by 191 days.

(21) Appl. No.: 12/393,493

(22) Filed: Feb. 26, 2009

(65) Prior Publication Data

US 2009/0218605 A1     Sep. 3, 2009

Related U.S. Application Data

(60) Provisional application No. 61/067,360, filed on Feb. 28, 2008, provisional application No. 61/124,433, filed on Apr. 17, 2008, provisional application No. 61/137,046, filed on Jul. 28, 2008, provisional application No. 61/205,592, filed on Jan. 22, 2009.

(51) Int. Cl.
    *H01L 21/336* (2006.01)
    *H01L 29/76* (2006.01)

(52) U.S. Cl. .................... 438/289; 257/288

(58) Field of Classification Search .............. None
See application file for complete search history.

(56) References Cited

U.S. PATENT DOCUMENTS

| | | | |
|---|---|---|---|
| 5,946,551 A | 8/1999 | Dimitrakopoulos et al. | |
| 6,180,956 B1 | 1/2001 | Chondroudis et al. | |
| 6,918,284 B2 | 7/2005 | Snow et al. | |
| 6,946,332 B2 | 9/2005 | Loo et al. | |
| 6,950,331 B2 | 9/2005 | Yang et al. | |
| 6,987,689 B2 | 1/2006 | Bozano et al. | |
| 7,033,525 B2 | 4/2006 | Blanchet-Fincher | |
| 7,041,539 B2 | 5/2006 | Fraboulet et al. | |
| 7,151,029 B2 | 12/2006 | Bozano et al. | |
| 7,179,329 B2 | 2/2007 | Boone | |
| 7,229,847 B2 | 6/2007 | Hsu et al. | |
| 7,247,354 B2 | 7/2007 | Blanchet-Fincher | |
| 7,294,560 B1 | 11/2007 | Nagahara et al. | |
| 2002/0151117 A1 | 10/2002 | Mutsaers et al. | |
| 2002/0163829 A1 | 11/2002 | Bulovic et al. | |
| 2002/0171125 A1 | 11/2002 | Bao et al. | |

(Continued)

OTHER PUBLICATIONS

X.-Z. Bo, C.Y Lee, M.S. Strano, M. Goldfinger, C. Nuckolls, Graciela B. Blanchet, "Carbon nanotubes-semiconductor networks for organic electronics: The pickup stick transistor", Applied Physics Letters 86, 182102, pp. 1-3 (2005).

(Continued)

*Primary Examiner*—Scott B Geyer
(74) *Attorney, Agent, or Firm*—Downs Rachlin Martin PLLC

(57) ABSTRACT

Methods of enhancing the performance of a field-effect transistor (FET) by providing a percolating network of metallic islands to the inversion layer of the FET so as to effectively reduce the channel length of the FET. The metal islands can be provided in a number of ways, including Volmer-Weber metallic film growth, breaking apart continuous metallic film, patterning metallic coating, dispersing metallic particles in a semiconducting material, applying a layer of composite particles having metallic cores and semiconducting shells and co-sputtering metallic and semiconducting materials, among others. FETs made using disclosed methods have a novel channel structures that include metallic islands spaced apart by semiconducting material.

33 Claims, 9 Drawing Sheets

U.S. PATENT DOCUMENTS

| | | |
|---|---|---|
| 2003/0121468 A1 | 7/2003 | Boone et al. |
| 2003/0162335 A1 | 8/2003 | Yuki et al. |
| 2003/0175427 A1 | 9/2003 | Loo et al. |
| 2004/0010028 A1 | 1/2004 | Nuckolls et al. |
| 2004/0021131 A1 | 2/2004 | Blanchet-Fincher |
| 2004/0027849 A1 | 2/2004 | Yang et al. |
| 2004/0065970 A1 | 4/2004 | Blanchet-Fincher |
| 2004/0104431 A1 | 6/2004 | Chen et al. |
| 2004/0192072 A1 | 9/2004 | Snow et al. |
| 2005/0040455 A1 | 2/2005 | Bozano et al. |
| 2005/0067629 A1 | 3/2005 | Woodall et al. |
| 2005/0165155 A1 | 7/2005 | Blanchet-Fincher |
| 2005/0237834 A1 | 10/2005 | Bozano et al. |
| 2006/0151778 A1 | 7/2006 | Fontana et al. |
| 2006/0219984 A1 | 10/2006 | Blanchet-Fincher |
| 2007/0120095 A1 | 5/2007 | Gruner |
| 2007/0153353 A1 | 7/2007 | Gruner |
| 2007/0153362 A1 | 7/2007 | Gruner |
| 2007/0153363 A1 | 7/2007 | Gruner |
| 2007/0154714 A1 | 7/2007 | Mirkin et al. |
| 2007/0164272 A1 | 7/2007 | Yang et al. |
| 2007/0205415 A1 | 9/2007 | Hotta |
| 2007/0224106 A1 | 9/2007 | Sakakibara et al. |
| 2007/0292601 A1 | 12/2007 | Nuckolls et al. |
| 2008/0012006 A1 | 1/2008 | Bailey et al. |

OTHER PUBLICATIONS

Related PCT Application No. US09/68992, filed Dec. 21, 2009, entitled Methods of Enhancing Performance of Field-Effect Transistors and Field-Effect Transistors Made Thereby, Ajaykumar R. Jain.

International Search Report and Written Opinion dated Jul. 21, 2010 for related application PCT/US2009/068992 filed Dec. 21, 2009 entitled "Methods of Enhancing Performance of Field-Effect Transistors and Field-Effect Transistors Made Thereby," Ajaykumar R. Jain.

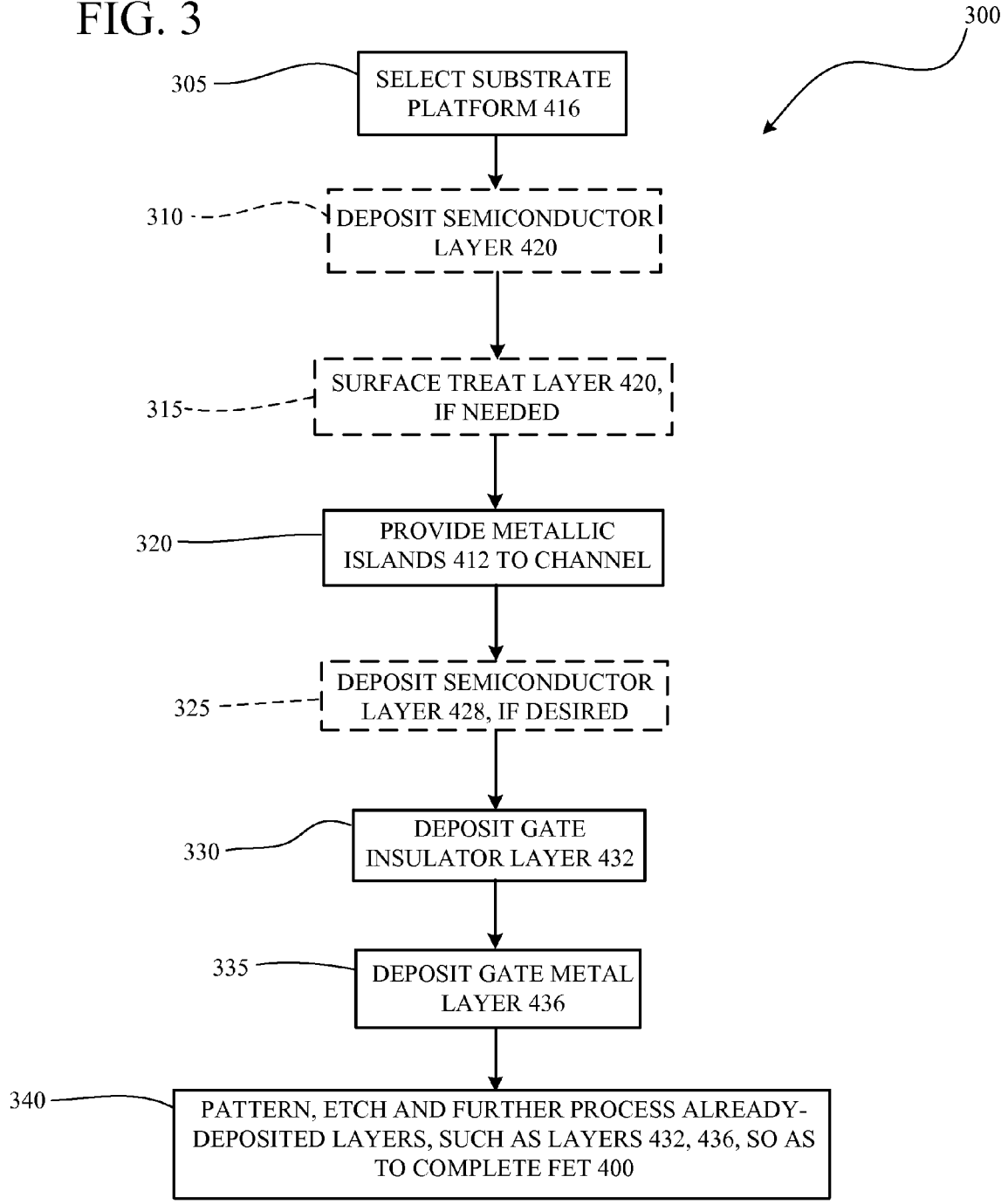

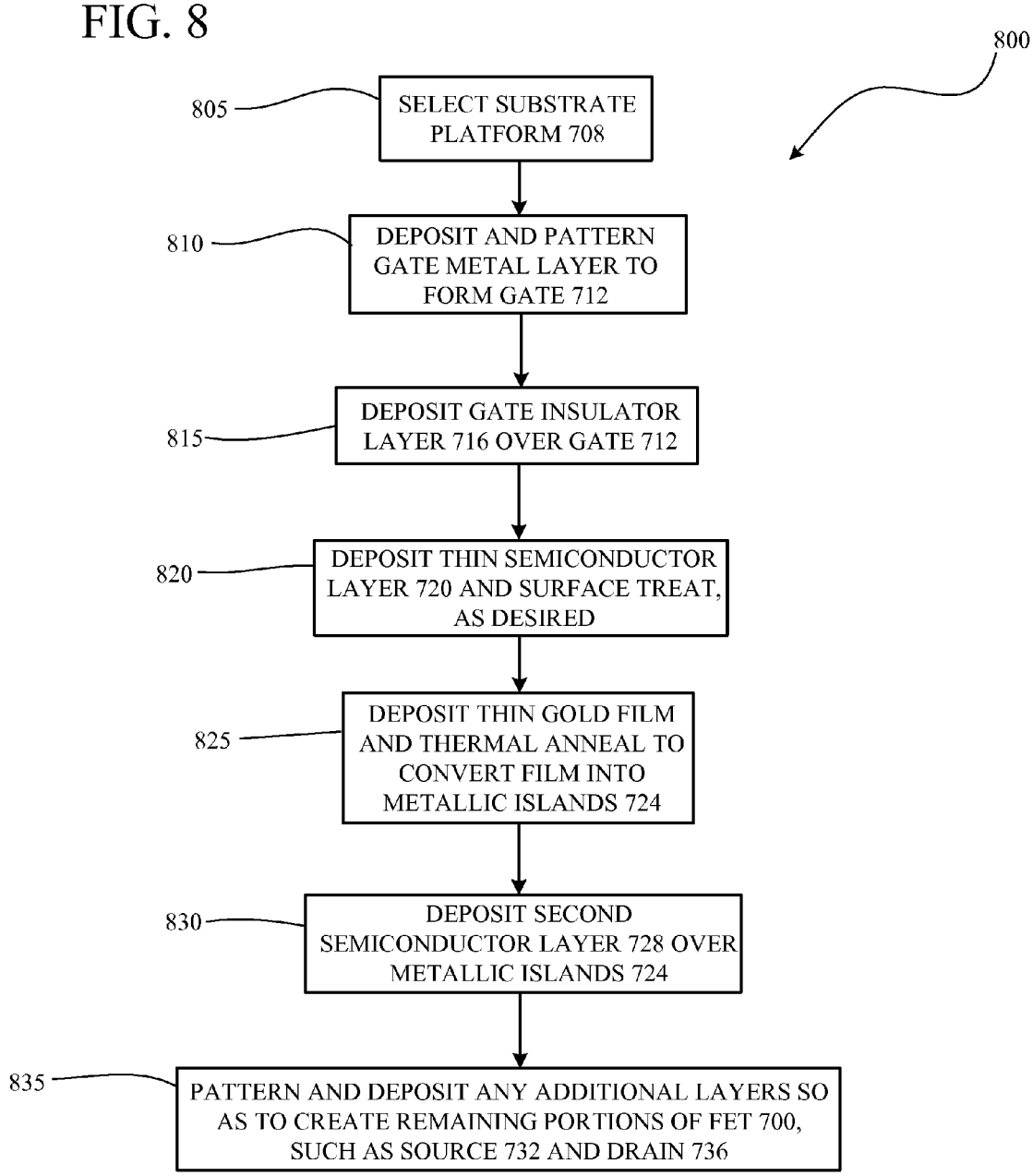

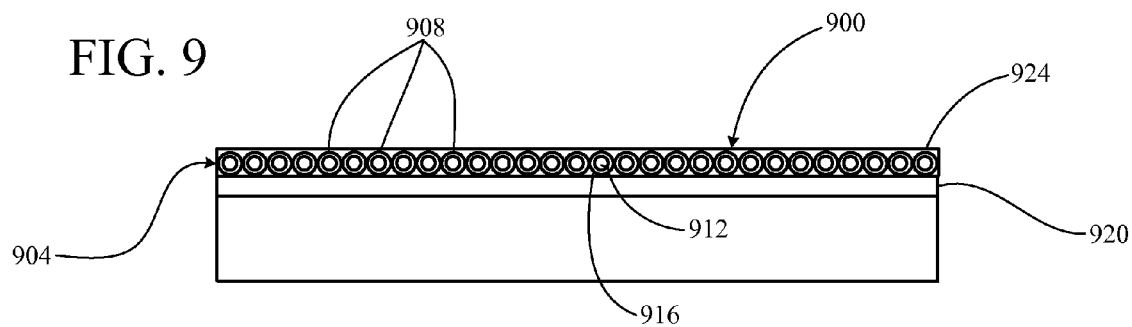
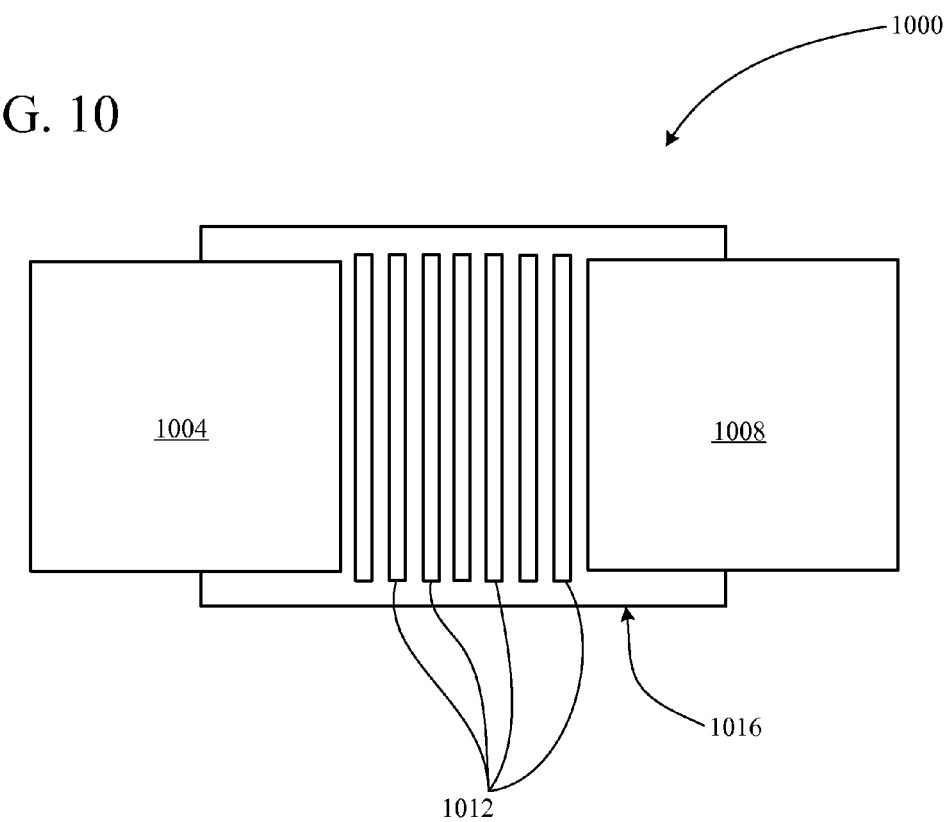

METHODS OF ENHANCING PERFORMANCE OF FIELD-EFFECT TRANSISTORS AND FIELD-EFFECT TRANSISTORS MADE THEREBY

RELATED APPLICATION DATA

This application claims the benefit of priority of: U.S. Provisional Patent Application Ser. No. 61/067,360, filed on Feb. 28, 2008, and titled "New And Novel Method To Enhance Performance In Active Semiconductor Devices;" U.S. Provisional Patent Application Ser. No. 61/124,433, filed on Apr. 17, 2008, and titled "New And Novel Method To Enhance Performance In Active Semiconductor Devices;" U.S. Provisional Patent Application Ser. No. 61/137,046, filed on Jun. 28, 2008, and titled "New And Novel Method To Enhance Performance In Active Semiconductor Devices" and U.S. Provisional Patent Application Ser. No. 61/205,592, filed on Jan. 22, 2009, and titled "New And Novel Method To Enhance Performance In Active Semiconductor Devices," each of which is incorporated by reference herein in its entirety.

FIELD OF THE INVENTION

The present invention generally relates to the field of active semiconductor devices. In particular, the present invention is directed to methods of enhancing performance of field-effect transistors and field-effect transistors made thereby.

BACKGROUND

Low temperature deposition of inorganic semiconductors used in industry typically yields amorphous and polycrystalline phases of the semiconductor. These phases tend to have significantly lower carrier mobility than can be realized in single crystal variants of the same semiconductor. For example, hydrogenated amorphous silicon is a ubiquitous material used in the LCD displays industry and the emerging solar cell industry. However electron carrier mobility in hydrogenated amorphous silicon is typically in the range of 0.3 $cm^2/V \cdot s$-1.2 $cm^2/V \cdot s$, depending on deposition conditions. Amorphous silicon may be re-crystallized, post deposition, using a technique called solid phase crystallization. The resulting nano and micro grained polycrystalline material might have mobilities between 10 $cm^2/V \cdot s$-250 $cm^2/V \cdot s$. However, this is still significantly below single crystal silicon mobilities of greater than 450 $cm^2/V \cdot s$. A similar pattern of deteriorating electronic performance is found in most semiconductors as the material goes from single crystal to polycrystal to amorphous phases.

Future trends in the display/electronics industry suggest that future displays, solar cells and electronic products will be made on flexible/conformal substrates. This transition is seen as inevitable to service the ever-present need and desire to reduce the size, weight and cost of devices we use without sacrificing performance. A wide gamut of devices from displays, electronics, and sensors, to name a few, would benefit from methodologies that result in the mass production of ruggedized, light weight, portable, small form factor, less power hungry, and lower cost devices. Furthermore, new and novel markets and opportunities could be addressed and opened up if these devices could be made flexible and/or conformal.

Typical performance metrics used in gauging the efficacy of an active semiconductor device are: device mobility, device speed, and the amount of current the device might be able to carry. Device mobility is related and affected by a multitude of factors such as: raw mobility of the semiconductor material used as the channel layer, say for example in a thin film transistor (TFT), the nature of the semiconductor/dielectric interface making up the TFT, device architecture, etc. Device speed depends linearly on device mobility but inversely on the square of the distance between the source and drain electrodes of the TFT. Similarly, the current carrying capacity of a TFT depends linearly on device mobility but inversely on the distance between the source and drain electrodes of the TFT.

As is widely known, device scaling is a common technique used to enhance active semiconductor device performance. Given constant device mobility, engineers are continually trying to reduce the distance between the source and drain of a TFT to get higher performance. However, this reduction in source/drain distance is conventionally accomplished by using very sophisticated and very expensive photolithography/patterning techniques. Such techniques are unsuitable for very large area substrates, and/or flexible substrates and/or end products that target very low cost applications.

To circumvent these challenges, scientists are exploring a new type of transistor, coined the "pickup stick transistor." In general, there are two basic type of pickup stick transistors. In the first type, nanotubes or nanorods/nanowires (hence the name "stick") form the semiconducting channel layer by themselves, and, in the second type, the nanotubes or nanorods (both metallic and semiconducting) are dispersed into an organic semiconducting host.

The operational principle of these pickup stick transistors is based on the concept of percolating networks, which are created within the dispersion of individual single-wall carbon nanotubes and narrow ropes within an organic semiconducting host. These percolating networks are randomized, discontinuous pathways between which charge carriers (electrons and holes) move. Percolation theory has been used to explain the conduction mechanism in nano/micro-crystalline silicon. Nano/micro crystalline silicon coatings consist of nano/micro crystallites of silicon embedded in a hydrogenated amorphous silicon host.

Although the pickup stick transistor has shown promise, it has quite a few shortcomings. For example, the transistor uses carbon nanotubes (CNTs) and, therefore, is not inexpensive to manufacture. The CNTs are made ex-situ, so there is on-going concern with material purity, material refinement, etc. CNTs vary greatly in length, diameter, chirality, and composition (metallic versus semiconducting). The deposition techniques used (spin coating) produce a non-aligned, random assortment of 2-D and 3-D CNT networks. This inconsistency translates to large variations in transistor performances (thereby limiting their use in a practical device). Indeed, one of the papers on pickup transistors itself points out that the "ability to increase mobilities without lowering the on/off ratios, key for device fabrication, cannot be achieved with random [single-wall nanotube] networks." Bo, et al., "Carbon Nanotubes-Semiconductor Networks For Organic Electronics: The Pickup Stick Transistor," Applied Physics Letters 86, 182102 (2005), at 182102-3 (emphasis added).

The inversion layer formed in the semiconducting channel layer in transistors (when activated) typically extends to a very small depth (<20 nm, more typically <10 nm) below the dielectric/semiconducting channel interface. This inversion layer ultimately dictates the performance of the transistor. In the pickup stick transistors being researched, there is no means to control the density of CNTs per unit area or volume within this inversion layer. This again translates to large variations in performance between different transistors in a group.

As mentioned above, nanotubes/nanorods/nanowires are used for conventional pickup stick transistors. For example, CNTs used were 2 nm in diameter, and ~1 micron in length. As is known, such high aspect ratio structures lead to significant electric field enhancement. The present inventor believes that this is the reason why these conventional pickup stick transistors see onset of shortages even at fairly large tube spacings. This is also pointed out in the above-mentioned publication: "A 1% threshold value for this transition, equivalent to a 30 nm tube to tube spacing, is quite reasonable for the onset of such shortage." Bo et al., at 182102-3.

Other shortcomings include the fact that the CNTs are dispersed in a host organic semiconducting matrix, which needs to be cured/baked post spin coating. The ultimate device performance is therefore gated by this starting host organic matrix. Organic semiconductors are known to have low starting material mobility, questionable lifetime, etc. In addition, the process singularly works with an organic host matrix and therefore is very limiting. Moreover, practical use of such pickup stick transistors would require completely new process tools, new fabs, new skill sets, etc.

SUMMARY OF THE DISCLOSURE

In one implementation, the present disclosure is directed to a method of a making a field-effect transistor (FET) having a source, a drain, a channel and a gate. The method includes: forming the source and the drain of the FET; forming the channel of the FET so that the channel extends from the source to the drain; forming the gate of the FET proximate the channel; and forming a gate-insulator layer between the channel and the gate; wherein the forming of the channel includes providing metallic islands in the channel so as to form a percolating network that extends between the source and the drain within the channel, substantially all of the metallic islands in the channel each having an aspect ratio of no greater than about 100.

In another implementation, the present disclosure is directed to a field-effect transistor. The field-effect transistor includes: a source; a drain spaced from the source; a channel extending from the source to the drain; a gate; and a gate-insulator layer between the gate and the channel; wherein the channel includes a percolation-network layer comprising a first semiconducting material and spaced metallic islands forming a percolating network extending between the source and the drain, all of the spaced metal islands in the channel each having an aspect ratio of no greater than 100.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 3 is a flow diagram illustrating a method of making an FET having a percolating network containing metallic islands;

FIG. 8 is a flow diagram illustrating a method of forming the bottom-gate FET of FIG. 7;

FIG. 9 is an enlarged cross-sectional view of an FET channel layer enhanced with a percolating network formed using composite metallic-core+semiconducting-shell particles;

FIG. 10 is a schematic plan view of a top-gate FET similar to the top-gate FET of FIG. 4A illustrating a percolating network having a highly regular pattern of metallic islands;

DETAILED DESCRIPTION

Figure 1:
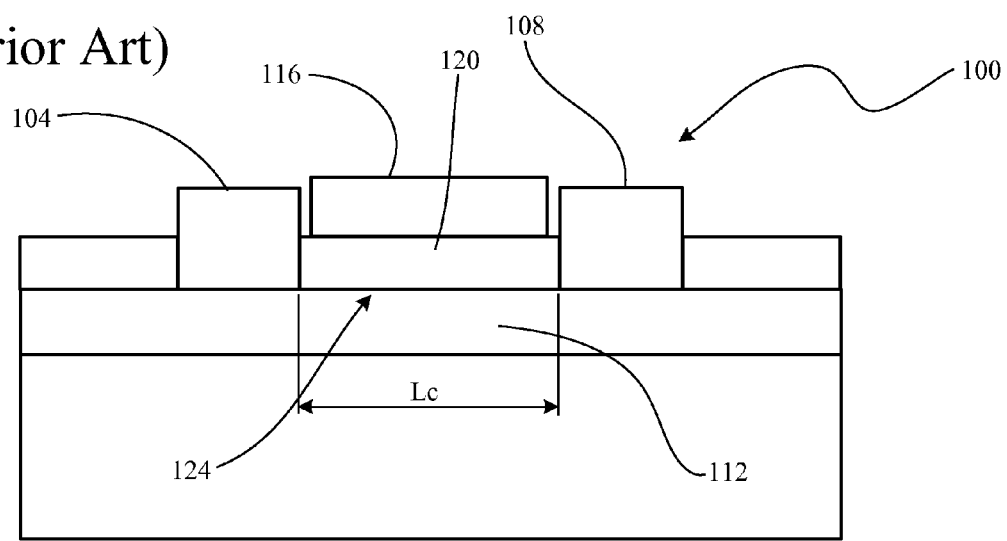
FIG. 1 is a cross-sectional view of a typical conventional semiconductor-based field-effect transistor (FET)

Referring now to the drawings, FIG. 1 illustrates a typical conventional semiconductor-based top-gate field-effect transistor (FET) 100 formed on a substrate. As usual, FET 100 includes source 104, a drain 108, a semiconducting channel 112 extending between the source and drain, a gate 116 and a gate-insulator 120 electrically insulating the channel from the gate. In this example, the length of channel 112 is denoted Lc. When FET 100 is activated via gate 116, the charge carriers (not shown) in an inversion layer 124, which forms within semiconducting channel 112 when the FET is activated, have to transverse length Lc of the channel between source 104 and drain 108. Because the charge carrier mobility of semiconducting channel 112 is relatively low, especially in a case where an organic semiconducting material is used in the channel, length Lc of the channel that the charge carriers must traverse can become a critical design parameter. However, depending on the technologies and device scales involved, there can be limits on minimum channel lengths that prevent designers from achieving the necessary channel lengths.

Figure 2:
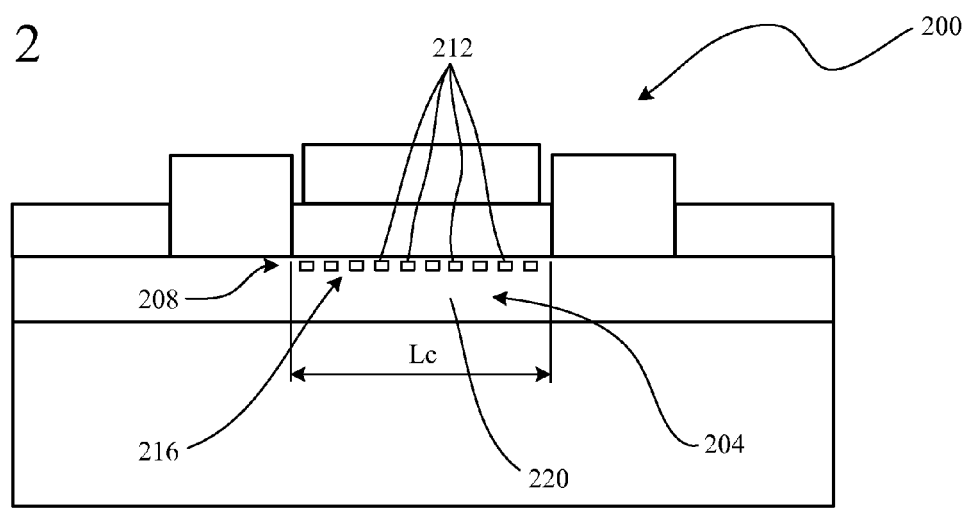
FIG. 2 is a cross-sectional view of an enhanced version of the FET of FIG. 1 enhanced with a percolating network containing metallic islands.

FIG. 2 illustrates an FET 200 that is largely identical to FET 100 of FIG. 1, including the length Lc of channel 204 in FET 200 being the same as length Lc of channel 112 in FET 100. An important difference between FET 200 and FET 100, however, is that the inversion layer 208 within channel 204 of FET 200 (FIG. 2) contains metallic islands 212 that form a percolating network 216 within the channel. Because the charge carrier mobility of these metallic islands is relatively very large with respect to the surrounding semiconductor material 220, the time it takes the charge carriers to traverse each metal island 212 is essentially instantaneous. Consequently, the critical charge carrier channel traversal time in FET 200 is largely the sum of the times it takes for the charge carriers to "hop" from one metal island 212 to the next in series across length Lc of channel 204. As can be readily appreciated, the presence of metallic islands 212 effectively shortens length Lc, thereby enhancing the performance of FET 200 relative to otherwise identical FET 100 of FIG. 1.

It is noted that the term "metallic" as it is used herein and in the appended claims means that the corresponding structure is made of a metal or other material that is highly electrically conductive when compared to a semiconducting material. Generally, a semiconducting material has a conductivity, σ(σ=l/(RA), wherein l is the length, R is the resistance and A is the cross-sectional area of a piece of material in question), of $10^{-9}$ cm$^{-1}$ to $10^2$ cm$^{-1}$, and a metallic material has a conductivity, σ, of greater than $10^2$ cm$^{-1}$. The term "metallic islands" is used herein and in the appended claims to denote the highly conductive structures that are "islands" separated from one another by intervening semiconducting material (organic, inorganic and combinations thereof). Generally speaking, metallic islands formed in accordance with the various methods of the present disclosure typically, though not necessarily, have aspect ratios (i.e., length-to-breadth ratio or ratio of greatest in-plane dimension to least in-plane dimension) of no more than 100, and more typically less than 50, which is at least an order of magnitude lower than the aspect ratio of single-wall carbon nanotubes used in pickup stick transistors known to the present inventor. For clarity, for an island formed from a thin film on a surface, the aspect ratio is the ratio of the greatest dimension of the island along the surface to the least dimension of the island along the surface. That is, the aspect ratio is not based on the film's thickness in a direction perpendicular to the surface.

As will be seen below, there are many methods of providing the inversion layer of an FET, such as FET 200 of FIG. 2, with metallic islands in accordance with the present invention. By way of brief introduction, however, examples of these methods include island-type (Volmer-Weber) metal film growth, breaking apart a continuous metal film, deposition and patterning metal film, depositing metal particles and depositing composite particles having metal cores and semiconducting shells, among others. Ones of these methods of providing an FET with a metal island percolating network have important and critical advantages over methods used to make conventional carbon-nanotube-based pickup stick FETs. For example, ones of the methods utilized herein allow for precise placement of metallic islands and/or highly controlled configuring of the resulting percolating network. In addition, ones of the disclosed methods are compatible not only with known organic semiconductor fabrication techniques, but also with known inorganic semiconductor fabrication techniques.

Following are a number of examples illustrating new and novel methods of enhancing performance of FETs and the new and novel FETs that are made thereby. It should be understood by those skilled in the art that the following examples are by no means exhaustive in terms of method of FET fabrication and FET structures that fall within the broad scope of the present disclosure. Rather, these examples are provided simply to illustrate in a practical manner the broad scope of the present disclosure. Those skilled in the art will undoubtedly devise other embodiments that implement the overarching concepts disclosed herein.

EXAMPLE 1

Referring now to FIGS. 3 and 4A-H, FIG. 4A illustrates a top-gate thin-film FET 400 having its channel 404 enhanced with a percolating network 408 that includes a plurality of metallic islands 412. FIGS. 4B-H show FET 400 at various stages of fabrication, and FIG. 3 outlines a method 300 of making FET 400 of FIG. 4A. At step 305 (FIG. 3), a substrate platform 416 (FIG. 4B) is selected. Substrate platform 416 may be made of any material(s) suitable for the subsequent fabrication techniques that will be used to form FET 400 and any other devices and structures that will ultimately be fabricated on the platform. Examples of properties for which a particular substrate may be selected for use as substrate platform 416 include, but are not limited to, thickness (thinness), surface finish, transparency (opaqueness), stiffness (flexibility), and chemical composition. In this example, substrate platform 416 is an LCD-industry standard glass substrate. However, depending on subsequent processing conditions, substrate platform 416 may be made of any one or more of a wide variety of materials, such as any one of the materials listed on pages 7-9 of the above-mentioned U.S. Provisional Patent Application Ser. No. 61/205,592 ("the '592 application") under the heading "Substrate Platform."

At optional step 310, a layer 420 (FIG. 4C) of semiconducting material is deposited onto substrate platform 416 using conventional deposition techniques suitable for the selected semiconducting material. In this particular example, layer 420 is a layer of hydrogenated amorphous silicon applied to glass platform 416. In other embodiments, the semiconductor material used for layer 420 can be nanocrystalline, microcrystalline, polycrystalline or crystalline, as desired, and may be any of a number of inorganic, organic and organic/inorganic mixture semiconducting materials, examples of which are given on pages 10 and 11 of the '592 application under the heading "Semiconductor material Composition." Fundamentally, there are no limits on the thickness of layer 420. If layer 420 is provided and if needed, at optional step 315, layer 420 can be surface treated.

At step 320, metallic islands 412 (FIG. 4A) are provided to at least the region of FET 400 that will become channel 404 in the finished device. Referring to FIGS. 4D-E, in this example metallic islands 412 (FIGS. 4A and 4E) are formed by first depositing a continuous thin (e.g., less than 10 nm) film 424 (FIG. 4D) of metal (here, gold) onto layer 420 and then thermally annealing the continuous film so as to break the continuous film into discrete metallic islands 412. In the thermal annealing process, film 424 and/or underlying substrate platform 416 can be heated using any suitable heating technique, such as using a furnace, lamp(s), laser(s), microwaves, RF radiation, electrical current, etc. Alternatively to thermal annealing, other types of impulses, such as shock waves (e.g., ultrasonic cavitation), ion beam etching, ion beam milling and ion implantation, among others, can be used to break apart continuous film 424. While film 424 is gold in this example, this film may be any of a large number of other metallic materials, including the metals, semi-metals and metallic materials listed on pages 11 and 12 of the '592 application under the heading "Metal Coating Layer."

An alternative way of forming film-based embodiments of metallic islands 412 is to grow the islands using the Volmer-Weber film growth regime and stopping the island growth before individual islands grow together into a continuous film. Thin film growth on any substrate occurs in one of the two broad categories of growth modes, namely, a layer-by-layer growth mode, or Stranski-Krastanov growth mode, and an island growth mode, or Volmer-Weber growth mode. Surface and interfacial energies determine the growth mode of a film. In general, vapor deposition of thin metal films on substrates proceeds in the island growth mode.

In the island growth mode, vapor atoms impinging on the substrate surface get adsorbed and are known as adatoms. These adatoms migrate on the substrate surface to form nuclei. When two nuclei touch each other they coalesce to form a larger cluster. As the deposition continues, at a particular surface coverage, a large scale coalescence takes place, thereby forming a network structure leaving holes and channels in between. Additional coating material leads to secondary nucleation in the holes and channels, filling them up to form a continuous film. Therefore, by limiting the growth of a film to nucleation stage or by avoiding excessive coalescence, island films or discontinuous films consisting of an array of discrete islands with statistical distribution of island radii and separations, can be obtained.

Another alternative way of forming islands 412 that are film based is to pattern and etch continuous film 424 using patterning and etching techniques, such as those listed on pages 12 and 13 of the '592 application in item 3 under the heading "Techniques for in-situ forming of the metal 'islands.'" Alternatively, physical obstruction masks could be used during the deposition of film 424 to create the islands.

Still other ways may be used to form islands 412 in situ. For example, some examples for entrapping metallic islands within a semiconducting layer include: ion implantation, sol-gel processing, gas/ion cluster beam deposition, ion exchange and ion irradiation, ion exchange and mask-assisted ion irradiation, etc. Heat treatments may be used during or post deposition to consolidate the metallic islands, if so desired. In addition, semiconducting and metallic materials can be co-deposited, for example, by co-sputtering from a composite semiconductor-metal target, or a metal-metal (multi-metal) target with reactive gas to convert one metal into a sputtered semiconductor coating would allow for the creation of entrapped metallic islands in a semiconductor host matrix. Alternatively, sequential sputtering from a semiconductor target and a metal target, or a metal target and another metal target with reactive gas to convert one metal into a sputtered semiconductor would allow for the creation of entrapped metallic islands in a semiconductor host matrix. Again, heat treatments may be used during or post deposition for further island consolidation. Single/Double/Multi ion-beam sputtering can be used to fabricate coating layers consisting of metallic islands (metal nanoparticles) embedded in a semiconductor matrix host.

In addition to the in-situ metallic island forming methods, metallic islands 412 may be provided by first forming nano (i.e., <100 nm) and/or micro (i.e., 100 nm to 10 microns) metallic particles or a coating containing such particles ex situ and then providing such particles or coating to the suitable platform, in this example to layer 420. In alternative embodiments, the ex-situ made particles or particle-containing coating can be deposited on another layer, such as a gate-insulator layer in a bottom-gate FET or directly on a base substrate platform, such as platform 416. Examples of suitable techniques for implementing ex-situ formation of the metallic islands include spin coating, spray coating, meniscus coating, roller coating, curtain or extrusion coating, electrodeposition or electrophoretic technique, ink jet printing, powder-jet processes, screen printing, dispensing and blading, gravure, flexo printing, drop-on-demand ink jet printing, sol-gel, dip-plating (dipping), super-saturated solutions, Langmuir-Blodgett process, molecular self assembly, or transfer processes such as nano-transfer printing, laser transfer, etc. The tendency of the metal particles to agglomerate may be reduced/eliminated by ionizing and charging the metallic particles during deposition, if necessary. The metal particles may be deposited "dry", or may be deposited "wet" in a carrier fluid, which may be subsequently removed (e.g., by heating, drying, evaporation, etc).

Nano and micro metallic particles made ex-situ may also be dispersed in an organic semiconductor and then deposited on top of another layer or a base substrate platform directly. The deposition techniques are already outlined as above. Post deposition of this mixture, the organic semiconductor may be cured, as required, and will form an integral part of the finished transistor device. Similar to the above techniques, the tendency of the metal particles to agglomerate can be reduced/eliminated by ionizing and charging the particles during deposition, if necessary. In this "wet" technique, the carrier (the organic semiconductor) will not be removed but, post curing (if required), will form an integral part of the finished transistor device.

In another ex-situ technique, nano and micro metallic particles made ex-situ may be coated with a thin layer of inorganic or organic semiconductor and then deposited on top of a layer or a base substrate directly. In such a case, the metal particles will form the core, and the thin layer of semiconductor material (organic or inorganic) will form the shell surrounding the core. The deposition techniques are already outlined as above. Again, the tendency of the particles to agglomerate may be reduced/eliminated by ionizing and charging the particles, if necessary. The core/shell particles may be deposited "dry," or may be deposited "wet" in a carrier fluid which may be subsequently removed (by heating, drying, evaporation, etc). In a variation of this shell-core composite particle concept, the shells of the composite particles may be created by forming the semiconducting shells by converting an outer region of each metallic particle to a semiconducting material so as to form a semiconducting layer around a metallic core. For example, particles of zinc may be partially oxidized so as to form a zinc oxide shell (which is semiconducting) around an unoxidized zinc core (which is metallic). These particles can then be either dry or wet deposited onto the desired surface. Other ways of forming metallic islands 412 suitable for percolating network 408 are possible.

Figure 5:
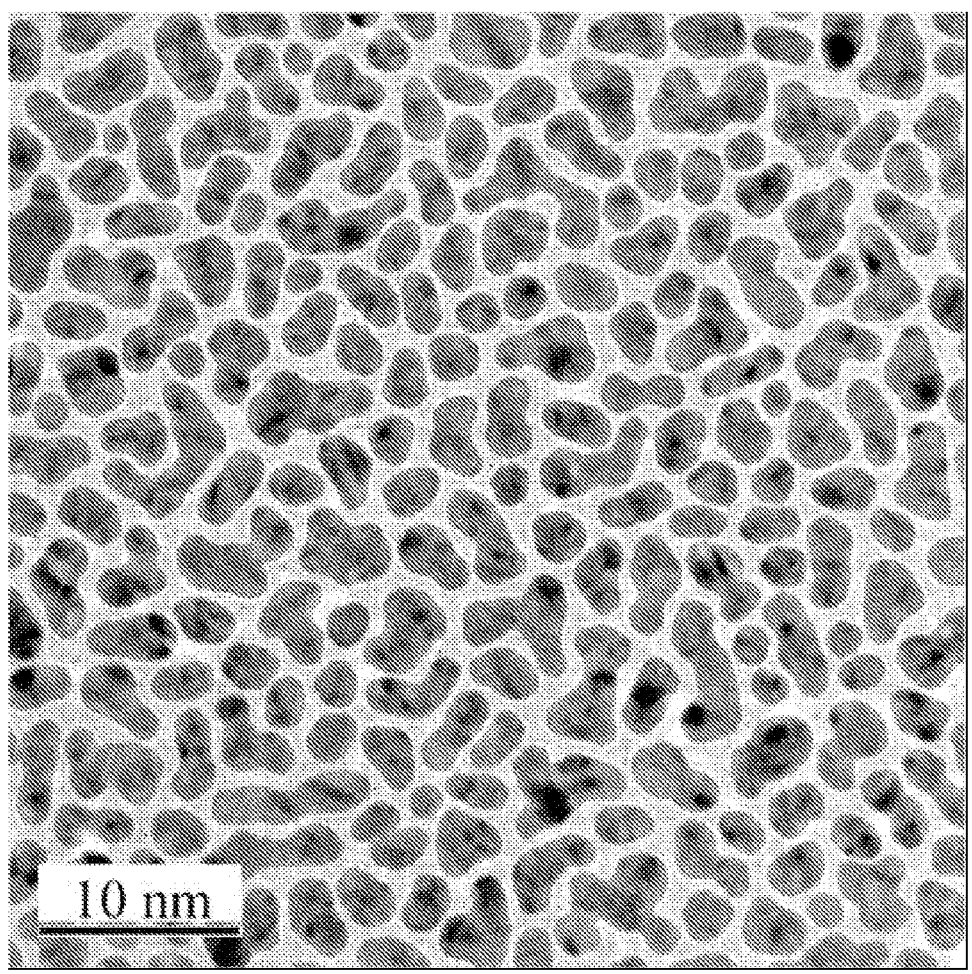
FIG. 5 is a transmission electron microscope photograph illustrating the metallic islands of the FET of FIG. 4A.

It is noted that the metallic islands can be formed over an entire substrate platform (or a layer formed thereon, such as a semiconducting layer) or can be formed at specific locations, as desired for a particular application. The metallic islands can be randomly arranged, such as shown in FIG. 5, or may be arranged in some pattern, for example, as illustrated in FIG. 10 referred to below. They can all be of the same size and shape, or different sizes and shapes. They can further be arranged within one another. As an example, imagine big islands separated from each other, and the big islands themselves composed of many small connecting/or discontinuous islands. The underlying semiconducting material may be additionally pre-treated or pre-conditioned to facilitate the formation of metallic islands, depending on the formation method used. For example, chemical treatments, plasma treatment, glow discharge, etc., may be used. Sub-monolayer amounts of transition metals like Nb, Ti, Ni, Cr, Zr, Ta, or Mo may be deposited prior to the deposition of the metal film. This pre-conditioning can be used to modify the minimum coalescence thickness of the metal film and obtain films with smoother topology. Alternatively, the semiconductor surface could be roughened to promote coalescence of the metal adatoms into metallic islands. Similarly, the metal film itself could also be treated post deposition so as to facilitate the formation of metallic islands, prevent the oxidation of the thin metal film/island, etc.

Figure 4A:
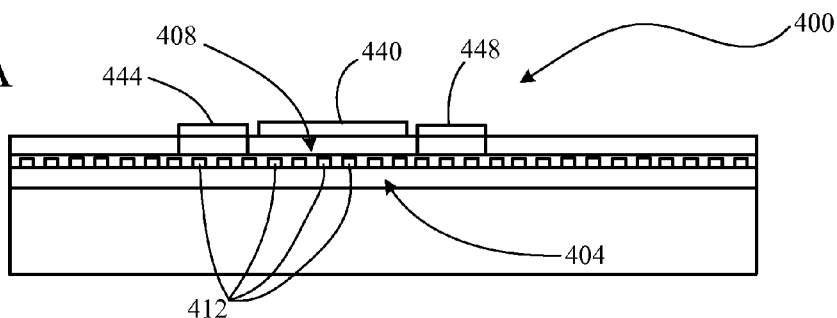
FIG. 4A is a cross-sectional view of an example top-gate FET enhanced with a percolating network containing metallic islands.
Figure 4B:
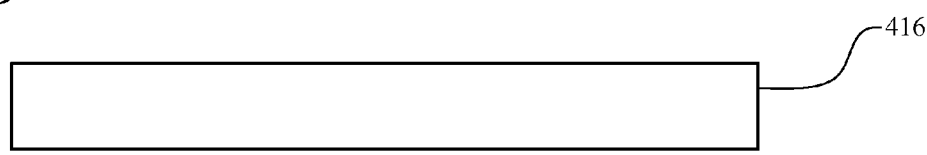
FIGS. 4B-H illustrates the FET of FIG. 4A at various stages during its fabrication.
Figure 4C:
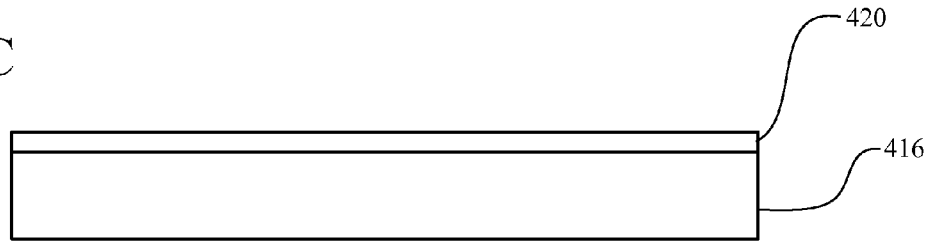
Figure 4D:
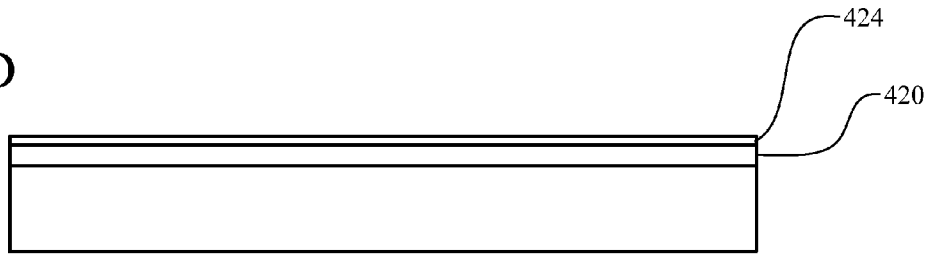
Figure 4E:
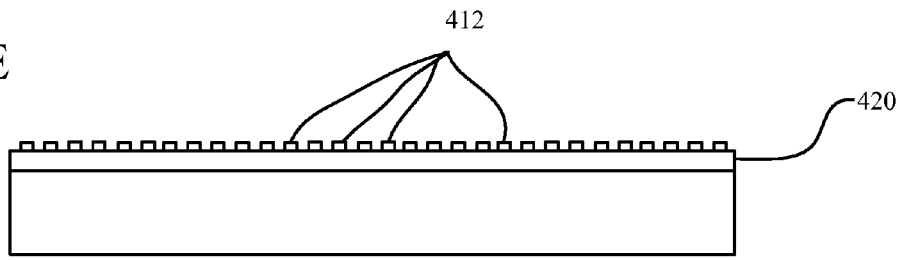
Figure 4F:
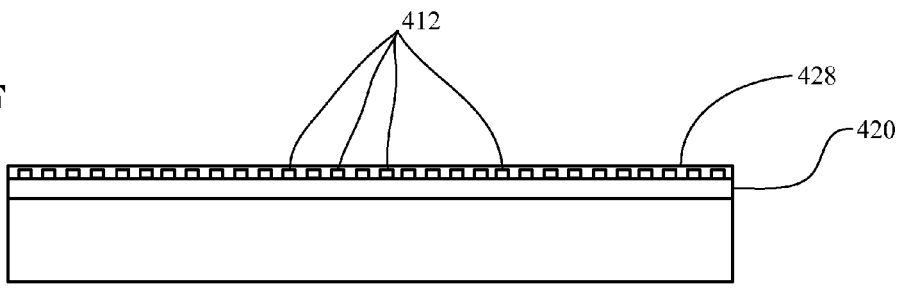

In this example and referring to FIGS. 3 and 4F, once metallic islands 412 have been formed (or otherwise provided), at optional step 325 (FIG. 3) a thin (e.g., less than 20 nm, and more desirably less than 10 nm) second layer 428 (FIG. 4F) of semiconducting material may be deposited over metallic islands 412 so as to submerge the metallic islands in semiconductor material. Here, second layer 428 of semiconducting material is the same hydrogenated amorphous silicon as used for layer 420 at earlier optional step 310, though the semiconductor material may be of any suitable kind, such as those noted above relative to layer 420. The depth of the now-submerged metallic islands 412 in second semiconducting layer 428 can be any depth from less than 1 nm up to several microns beneath the free surface of second layer 428. Depending on the structure of metallic islands 412, once second semiconducting layer 428 has been deposited, its surface may be undesirably rough for subsequent processing steps. If that is the case, second layer 428 can be planarized to reduce the roughness. Such planarizing may be performed to a point that metallic islands 412 become exposed, in which case the metallic islands can be considered only partially submerged.

Figure 6:
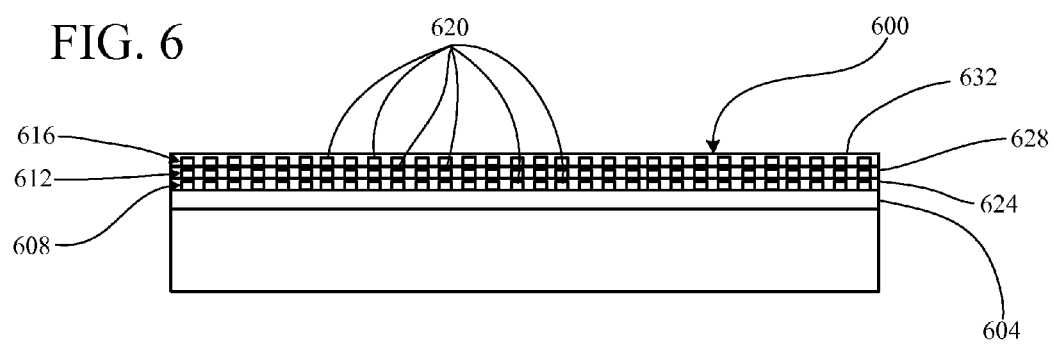
FIG. 6 is a cross-sectional view of a multi-tiered 3-D percolating network of metallic islands that can be used to enhance performance of FETs.

In FIG. 4F, metallic islands 412, due to their nature, may be considered to be in a 2-D plane within channel 404 (FIG. 4A). However, in other embodiments, the metallic islands may be distributed within channel 404 of FIG. 4A in more of a 3-D manner. This can be accomplished in any of a number of ways. For example and referring to FIG. 6, if one of the film-based methods is used to form the metallic islands, the process can be repeated multiple times so as to form a multi-tiered structure 600. In FIG. 6, multi-tiered structure 600 includes an initial semiconducting layer 604, three island layers 608, 612, 616 of metallic islands 620 spaced from one another by a pair of semiconducting layers 624, 628, and a top semiconducting layer 632. It will become apparent from reading this entire disclosure that 3-D percolating networks can be formed using methods of forming metallic islands other than film-based methods. Some of these other methods are described below in subsequent examples.

Figure 4G:
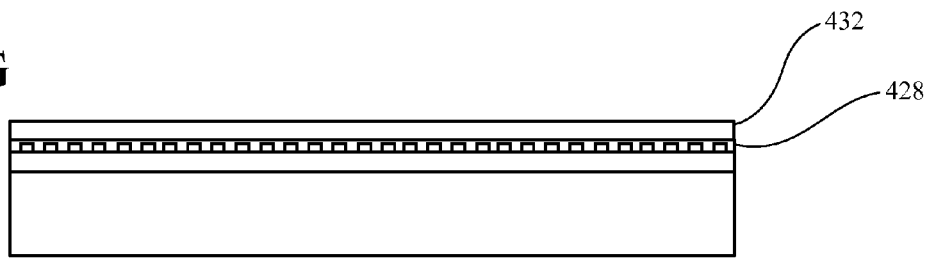
Figure 4H:
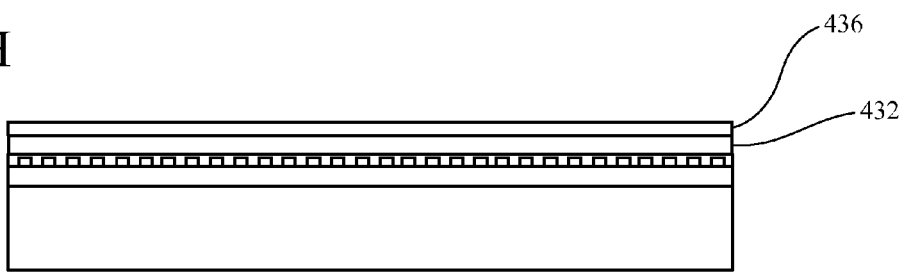

Referring again to FIG. 3, and also to FIG. 4G, after second semiconducting layer 428 has been deposited (and optionally planarized), at step 330 a gate-insulator layer 432 is deposited. Gate-insulator layer 432 can be deposited using any suitable method and may be made of any material compatible with the particular design and prior and subsequent fabrication steps. Examples of insulating materials that can be used for gate-insulator layer 432 appear on pages 16-18 of the '592 application under the heading "Insulator layers." At step 335, a gate metal layer 436 (FIG. 4H) is deposited onto gate-insulator layer 432 using any suitable technique. At step 340 the already-deposited layers 432, 436 are patterned and etched and additional processing is performed so as to create the necessary features of finished FET of FIG. 4A, such as gate 440, source 444 and drain 448. Example materials for various device layers, such as gate metal layer 436, appear on pages 18-20 of the '592 application under the heading "Device Coating layers," and example patterning and etching techniques appear on page 20 of the '592 application under the heading "Etching the device coating layers to create desired patterns." It is noted that patterning and etching steps can be interspaced in the deposition steps above as dictated by a particular device architecture.

EXAMPLE 2

Figure 7:
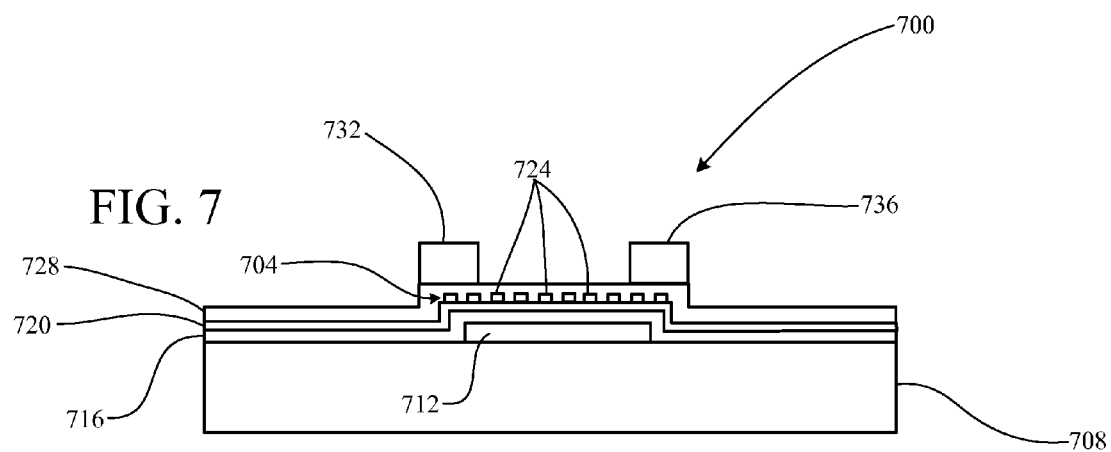
FIG. 7 is a cross-sectional view of a bottom-gate FET enhanced with a percolating network containing metallic islands.

FIG. 7 illustrates a bottom-gate FET 700 enhanced with a metallic-island percolating network 704. This example is a variation of FET 400 of EXAMPLE 1, above, with FET 700 of FIG. 7 essentially inverted relative to FET 400 of FIG. 4A. The bottom-gate configuration of FET 700 avoids any negative effect that a rough surface of second semiconducting layer 428 (FIG. 4F) may have on the operation of a finished device. In a typical active semiconductor device, such as a thin film transistor (TFT), the quality of the materials in the region adjacent to semiconductor/gate insulator interface affects the overall performance of the transistor. The quality of the gate-insulator layer determines the leakage current and the combined quality of the insulator layer, the semiconductor layer, and the interface between the semiconductor and the insulator layer determines device mobility.

The inversion layer (or the active layer) forms in the semiconductor channel layer (when the device is activated) and the depth of this layer is very shallow. It typically only extends a few nanometers inside the semiconductor channel layer from the insulator/semiconductor interface. Besides the nature and quality of the materials in the region adjacent to the semiconductor/gate insulator interface, the surface roughness of the interface itself, also affects how well the transistor will perform. In the embodiment of EXAMPLE 1 (FIG. 4A), above, semiconducting layer 420 was deposited first and then thin (e.g., less than 10 nm) metal islands 412 were deposited (created) and subsequently encased in an additional thin (e.g., less than 20 nm, and more desirably less than 10 nm) second layer 428 of semiconducting material. If gate-insulator layer 432 is then deposited on top of second semiconducting layer 428 without planarizing the second semiconducting layer first, the interface might show increased surface roughness due to the fact that metallic islands 412 have a certain height relative to the surrounding bare regions of semiconducting layer 420, especially if second semiconducting layer 428 is a conformal layer. This roughness can potentially degrade the performance of FET 400. As mentioned above, one option is to conduct an additional planarization step prior to depositing gate-insulator layer 432. However, this might not always be practical.

Alternatively, the coating stack of FET 400 of FIG. 4A can be inverted, such as shown in FET 700 of FIG. 7. FIG. 8 illustrates a method 800 of making a particular instantiation of FET 700. At step 805, an LCD industry standard, glass substrate platform 708 (FIG. 7) is selected. At step 810, a gate metal layer is deposited on top of substrate platform 708 and is patterned and etched to form a gate 712 (or a plurality of gates when a plurality of like transistors are being formed simultaneously). At step 815, a gate-insulator layer 716 is deposited on top of gate 712. At step 820, a thin (here, less than 20 nm, and more desirably less than 10 nm) layer 720 of hydrogenated amorphous silicon is deposited over gate-insulator layer 716 and surface treated, if so desired. At step 825, a thin (here, less than 10 nm) film of gold is deposited onto layer 720, and a thermal anneal is performed to convert the gold metal film into metallic islands 724, if necessary (as mentioned above, by operating in the Volmer-Weber film-growth regime with proper deposition parameters and semiconductor surface preparation, this step would be unnecessary as the islands are formed by that growth process).

At step 830, a second layer 728 of hydrogenated amorphous silicon is deposited onto metallic islands 724 and regions of the surface of semiconducting layer 720 surrounding the islands so as to substantially encase the islands in semiconducting material. At step 835, any additional layers are deposited and patterned so as to create remaining portions of FET 700, such as source 732 and drain 736. It is noted that while very specific materials appear in method 800, those skilled in the art will readily understand that many substitutions can be made in alternative instantiations, depending on the needs/requirements of a particular design. Indeed, any of the materials referred to above in connection with EXAMPLE 1 can be substituted for the materials called out in method 800 as long as the substitute materials are compatible with the design and fabrication steps.

EXAMPLE 3

In the particular instantiations of EXAMPLES 1 and 2 the semiconducting material used for semiconducting layers 420, 428 (FIGS. 4C, 4F) and 720, 728 (FIG. 7), respectively, is hydrogenated amorphous silicon, which is an opaque material. It is known that ultra thin layers (e.g., less than 20 nm thickness) of aluminum, gold, silver, copper, nickel, chrome, inconel, etc. are semi-transparent to almost transparent to visible radiation between 400 nm and 700 nm. The present inventor proposes to use transparent and semi-transparent metallic islands composed of such ultra thin metal layers along with transparent semiconducting oxides in lieu of opaque semiconducting materials to make largely visibly transparent electronics. In FETs 400, 700 of FIGS. 4A and 7, respectively, the opaque layers 420, 428, 720, 728 can be made of transparent semiconducting oxides such as: ZnO, In2O3, SnO2, Ga2O3, CdO, PbO2, InGaZnO, ZnSnO (ZTO), ZnInO (ZIO), Cadmium indium antimony oxide and other multi-component amorphous oxides (MAOs). All the other manufacturing steps and configurations can be identical to those described in EXAMPLES 1 and 2 as relevant.

EXAMPLE 4

It was mentioned above that one method of forming a metallic island percolating network suitable for enhancing the performance of FETs includes forming composite metallic-core+semiconducting-shell particles ex-situ and then depositing such particles onto an appropriate substrate platform or layer applied to that platform. FIG. 9 illustrates an FET channel layer 900 that includes a percolating network 904 formed from such composite particles 908. Each composite particle 908 includes a metallic core 912 and a semiconducting shell 916 and may be made ex situ in a variety of ways. For example, metallic cores 912 may be starting nano and/or micro size metal particles that are coated with a thin layer of inorganic or organic semiconducting material that forms shells 916. In another example, the ex situ process of forming composite particles 908 starts with nano/micro particles of, for example, zinc. The zinc particles are then treated chemically to convert their exteriors to an oxide, such that the zinc oxide forms shells 916 around the zinc interior regions that become the metal cores 912 of particles 908. With judicious choice of processing conditions the ZnO shell can be semiconducting in its properties (and not an insulative oxide). Alternate starting metallic particles might be indium, gallium, cadmium, silver, copper, tin, lead and antimony, among others. It is also noted that the starting nano/micro particles may be chemically treated to readily create a semiconductor shell of sulphides, selenides, tellurides, etc. In yet another example, the starting nano/micro metallic particles are composed of conductive organic polymers and coatings (made ex-situ) and are coated with a thin layer of an inorganic or organic semiconductor and then deposited on top of a semiconductor layer or a base substrate platform directly. Phase separation between the conductive organic polymer particles and a thin layer of organic/inorganic semiconductor material can also be used to create substantially the same effect.

In the example of FIG. 9, composite particles 908 are applied essentially as a 2-D layer, in this case on top of a suitable semiconducting layer 920. In addition, all composite particles 908 are shown as being of the same size. However, in other embodiments the composite particles may be applied in a thicker layer, with ones of the particles stacked upon one another. When such particles are stacked and are of differing sizes, smaller ones of the particles can fill the interstices among larger ones of the particles. Here, after composite particles 908 have been provided to semiconducting layer 920, a second semiconducting layer 924 may be deposited, if desired. This second layer 924 can act to unify composite particles into a monolithic layer. Completing of an FET (not shown) from the precursor structure illustrated in FIG. 9 can proceed as outlined in EXAMPLE 1 above. As those skilled in the art will understand, composite-particle-based percolating network 904 can readily be incorporated into a bottom-gate FET, for example, using steps described in connection with EXAMPLE 2, above.

Referring again to FIG. 3 and FIG. 4F, it is noted here for clarity that the reason either or both of steps 310 and 325 are optional because in an extreme example it is possible that composite particles, such as composite particles 908 of FIG. 9 can be used alone to form a channel layer of a particular FET. In that case, neither layer 920 nor layer 924 is necessary. That said, when using those composite particles, it is likely that at least a semiconducting layer deposited after the composite particles are provided would be used to fill any voids among the particles and unify the particulate layer.

EXAMPLE 5

In the explicit examples noted above based on Volmer-Weber film growth, thermal annealing of a continuous film and providing of ex-situ-formed composite particles, the arrangement of metallic islands is largely random. However, it was mentioned above that patterning techniques can be used. Consequently, in other embodiments the metallic islands can be precisely located relative to one another and relative to components of an FET to which they are provided. For example, FIG. 10 is a view looking down on a top-gate FET 1000 showing the source 1004, the drain 1008 and a plurality of patterned metallic islands 1012 embedded in the channel layer 1016 of the FET. As seen in FIG. 10, here metallic islands 1012 are highly regular not only in shape, but also in position relative to one another and relative to source 1004 and drain 1008. As can be appreciated, with such great control of the formation and positioning of metallic islands 1012, a designer has great control over the physical structure and, therefore, electrical characteristics, of FET 1000. FET 1000 can be fabricated using any of the materials and patterning/writing techniques mentioned above in connection with EXAMPLE 1 for controllably forming metallic islands 1012 and any of the materials and techniques mentioned above for forming other components of FET 1000.

EXAMPLE 6

Figure 11A:
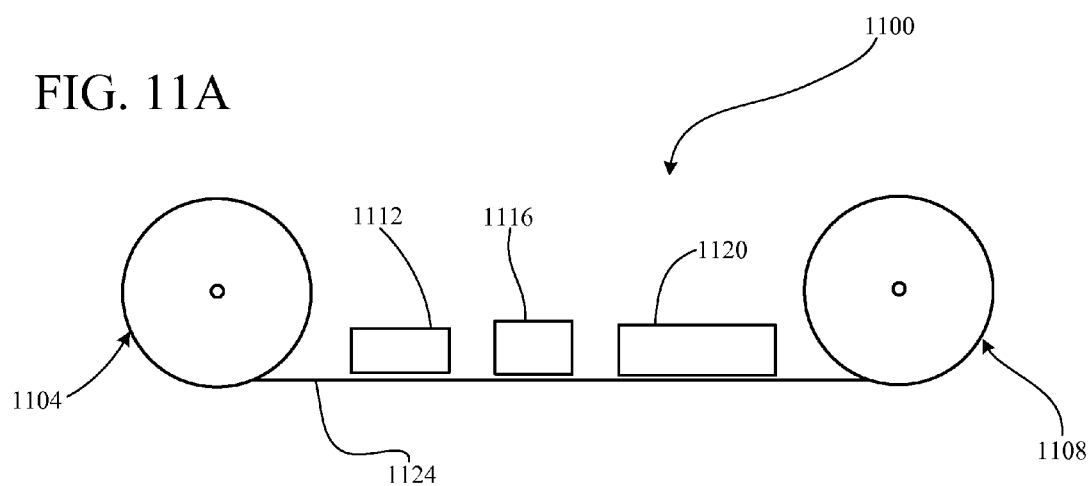
FIG. 11A is a schematic view of a roll-to-roll device fabrication system that can utilize metallic-island forming techniques of the present disclosure.

As those skilled in the art will appreciate, metallic-island-forming techniques of the present disclosure allow FETs made therewith to perform as fast as much smaller devices due to the highly electrically conductive nature of the metallic percolating networks. This fact can significantly reduce the constraints on photolithography and pattern generation (registration and alignment, feature overlap, critical overlap, etc.). Consequently, electronics that may not have been amenable to roll-to-roll manufacturing can now be made using roll-to-roll techniques. FIG. 11A illustrates a roll-to-roll system 1100 that could be used to create percolation-network-enhanced FETs and other devices. In this example, roll-to-roll system 1100 includes a feed spool 1104, a take-up spool 1108 and several device processing stations, here only three such stations 1112, 1116, 1120 illustrated for convenience. Feed spool 1104 can pay out a flexible substrate platform 1124, which may or may not include one or more additional layers, such as a semiconducting layer, a gate layer, a gate-insulator layer, etc., depending on the configuration of system 1100. Stations 1112, 1116, 1120 can be configured to perform any of the various steps needed to fabricate any one of the performance-enhanced FETs disclosed herein and any additional circuit components, or portions thereof, as desired to suit a particular fabrication setup. Of course, more stations may be provided to system 1100 as needed.

Figure 11B:
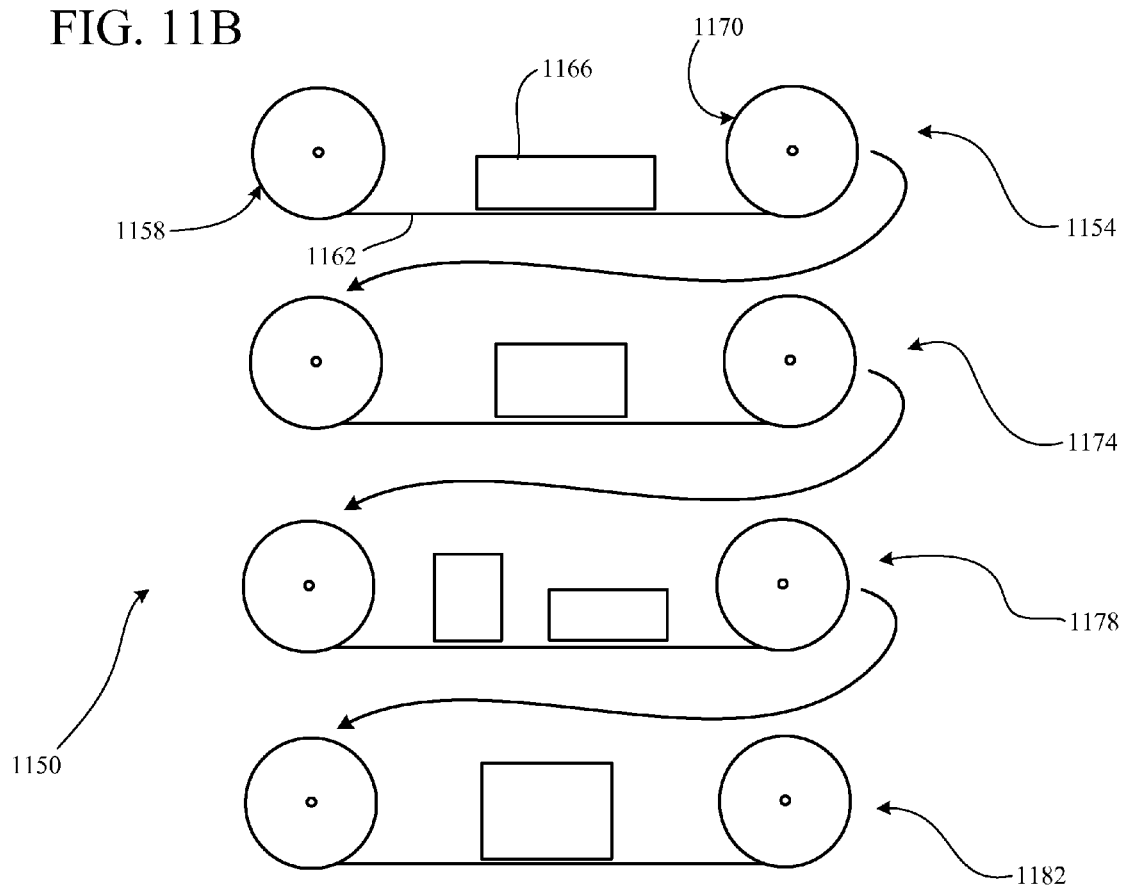
FIG. 11B is a schematic view of an alternative roll-to-roll device fabrication system that can utilize metallic-island forming techniques of the present disclosure.

FIG. 11B illustrates an alternative roll-to-roll system 1150 that includes a single-station setup 1154. In this embodiment, feed spool 1158 pays out a web 1162 of either a bare or partially processed substrate platform, and a processing station 1166 performs one or more processing steps. The just-processed web 1162 is then taken-up by take-up spool 1170. When take-up spool 1170 is full, it may then be moved to another processing setup 1174 that performs one or more additional processing steps as needed to suit a particular fabrication setup. In this example, there are two additional processing setups 1178, 1182 that perform yet additional processing steps after processing has been completed at processing setup 1174. Each processing setup 1174, 1178, 1182 may be a single-station setup similar to processing setup 1154 or may be a multi-station setup similar to processing system 1100 of FIG. 11A. Those skilled in the art will readily appreciate the many variations of roll-to-roll processing that can be implemented using the FET-performance-enhancing concepts disclosed herein.

Benefits of the processes, structures and manufacturing methodologies described above include the following:

- The revealed technologies allow for "best of breed" solutions for specific needs and are compatible with all current process chemistries and temperature ranges.
- High device reliability is achievable due to the technologies being executable with known and well-categorized manufacturing processes and tools.
- The revealed technologies use relatively inexpensively made metallic islands as opposed to carbon nanotube and other exotic pickup stick transistors.
- The purity and composition of the metallic islands and their precursor materials can be controlled in a batch and from batch to batch quite readily, resulting in more consistent device performance.
- The size and shape of the metallic islands can be regulated as desired, resulting in more consistent device performance.
- The spacing between the metallic islands can be controlled as desired, resulting in more consistent device performance.
- The locations of the metallic islands in the inversion layer formed in an activated transistor can be controlled readily, resulting in more consistent device performance.
- The revealed technologies are applicable universally to both inorganic and organic active semiconductor devices.
- Unlike carbon nanotubes and other high-aspect-ratio structures, the metallic islands do not suffer from shortages even at fairly small island spacings.
- The revealed technologies allow for the realization of enhanced performance in TFTs used in the display industry. This enhanced performance will obviate the need for developing poly-crystalline silicon fabrication facilities, as are needed for higher performance OLED displays.
- The revealed technologies will allow for the creation of opaque/transparent electronic circuits that may be rigid, flexible, conformal, rollable, or foldable.
- The revealed technologies can be used in state-of-the-art CMOS (Silicon) fabrication facilities. This enhanced performance will obviate the need for developing new scaling nodes, and/or higher performance semiconducting materials.
- The revealed technologies could also be used in state of the art GaN, GaAs, etc. fabrication facilities. This enhanced performance will obviate the need for developing new scaling nodes for these semiconducting materials.
- The revealed technologies can be readily adopted into standard semiconductor and LCD fabrication facilities with minimal tool modification.
- The revealed technologies utilize and leverage all existing technological and capital platforms, from manufacturing and production to inspection and analysis, and as such is easily integratable and thereby low in cost. No multi-billion-dollar reinvestments and/or significant technological hurdles need to be crossed, thereby affording significant cost savings and reduction in time to market.
- The enhanced transistor performance resulted by the revealed technologies will allow for utilization of larger feature sizes for transistors, which in turn will reduce photolithographic constraints on their production and potentially allow for roll-to-roll manufacturing.
- The performance enhancement due to the revealed technologies will manifest itself in any one or more (or all) of the following ways:
    - increased field effect mobility;
    - large on/off current ratio;
    - small sub-threshold slope; and
    - low threshold voltage (translating to lower power consumption).
- A nagging problem with conventional amorphous hydrogenated silicon transistors is the threshold voltage shifts the transistors experience over time and with bias stressing. A significant aspect of the revealed technologies, i.e., reduction in threshold voltage, might allow for lower excursions of threshold voltage for amorphous hydrogenated silicon transistors.

The term "FET" in context of this present disclosure is meant to include, but not be limited to, thin film transistors (TFTs) and thick film transistors. These can include three terminal TFTs made of CdSe, amorphous silicon, high temperature poly silicon, low temperature poly silicon, ultralow temperature poly silicon, polymers, etc. The FETs may be of the PMOS or NMOS flavor. They may have planar structures, or staggered structure. They may be bottom gate/top gate etc. As an example consider the following variety of TFT architectures in current use: Top gate bottom contact, Top gate top contact, Bottom gate top contact, Bottom gate bottom contact, Coplanar, Inverted coplanar, Staggered, Inverted staggered, Horizontal, Vertical, etc. The FETs may be operated in "Accumulation mode", "Depletion mode", "Enhancement mode", "Inversion mode", etc. As should be apparent to those skilled in the art from above, there is a virtually infinite variety of device architectures in current use, each tailored for optimum devices performance.

The revealed technologies are applicable to the display industry (display industry refers to television, high-definition television, indoor and outdoor signs, advertising signs, screens, electronic paper, etc.), for example, as follows. They can be used to create and enhance performance in rigid, flexible, conformal, foldable, rollable active matrix TFT back planes for displays. They can be used to enhance performance in opaque or transparent active matrix TFT back planes. The active matrix created using this method may be mated to a front plane of liquid crystals, electrophoretics, electrochromic, rotating ball type, bi-stable type, organic light emitting diodes (small molecule, polymer, phosphorescent, quantum dot, etc. based) touch panels, etc. Some of these devices are reflective, some are self-emissive, whereas others are backlit and/or transparent. As is widely known, active matrix schemes allow for reduced power consumption, higher brightness and expanded gray scale capabilities. The revealed technologies are also applicable to the sensor industry, as well as the electronic integrated circuitry industries, as they allow for enhanced performance in rigid, flexible, conformal, foldable, rollable, single- and multi-layer electrical integrated circuits and sensors.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of making a field-effect transistor (FET) having a source, a drain, a channel and a gate, comprising:
   forming the source and the drain of the FET;
   forming the channel of the FET so that the channel extends from the source to the drain;
   forming the gate of the FET proximate the channel; and
   forming a gate-insulator layer between the channel and the gate;
   wherein said forming of the channel includes providing metallic islands in the channel so as to form a percolating network that extends between the source and the drain within the channel, substantially all of the metallic islands in the channel each having an aspect ratio of no greater than about 100.

2. The method according to claim 1, wherein said providing of the metallic islands in the channel includes providing the metallic islands so that substantially all of the metallic islands in the channel each have an aspect ratio of no greater than about 50.

3. The method according to claim 1, wherein said forming of the channel includes forming a first layer of semiconducting material, and said providing of the metallic islands includes providing the metallic islands on the first layer.

4. The method according to claim 3, wherein said forming of the channel includes at least partially encasing the metallic islands in a second layer of semiconductor material.

5. The method according to claim 1, wherein said providing of the metallic islands includes providing premade metal particles and said forming of the channel includes at least partially submerging the premade metal particles in a layer of semiconductor material.

6. The method according to claim 1, wherein said providing of the metallic islands includes providing composite particles having metal cores and semiconductor shells.

7. The method according to claim 6, wherein said forming of the channel further includes encasing the composite particles in a layer of semiconductor material.

8. The method according to claim 6, wherein said forming of the gate-insulator layer includes depositing the gate-insulator layer directly on the composite particles.

9. The method according to claim 1, wherein said providing of the metallic islands includes depositing a continuous metallic film and converting the continuous metallic film into the metallic islands.

10. The method according to claim 9, wherein said converting of the continuous metallic film into the metallic islands includes subjecting the continuous metallic film to an outside impulse so as to break the continuous metallic film into the metallic islands.

11. The method according to claim 10, wherein said subjecting of the continuous metallic film to an outside impulse includes heating the continuous metallic film so as to break the continuous metallic film into the metallic islands.

12. The method according to claim 9, wherein said converting of the continuous metallic film into the metallic islands includes removing portions of the continuous metallic film so as to form the metallic islands.

13. The method according to claim 1, wherein said providing of the metallic islands includes growing a metallic film by an island growth mode and stopping said growing before the metallic film becomes a continuous film.

14. The method according to claim 1, wherein said providing of the plurality of islands includes providing the plurality of islands in a random pattern.

15. The method according to claim 1, wherein said providing of the plurality of islands includes providing the plurality of islands in a predetermined pattern.

16. The method according to claim 1, wherein said providing of the metallic islands includes providing the metallic islands after the gate layer has already been provided.

17. The method according to claim 1, wherein said forming of the first layer of semiconductor material includes forming an inorganic semiconductor layer.

18. The method according to claim 1, wherein a semiconductor/gate-insulator interface is formed between the channel and the gate-insulator layer when the FET is completed, and said providing of the metallic islands in the channel includes providing ones of the metallic islands so that the ones of the metallic islands are spaced from the semiconductor/gate-insulator interface by less than 20 nanometers.

19. A field-effect transistor, comprising:
   a source;
   a drain spaced from said source;
   a channel extending from said source to said drain;
   a gate; and
   a gate-insulator layer between said gate and said channel;
   wherein said channel includes a percolation-network layer comprising a first semiconducting material and spaced metallic islands forming a percolating network extending between said source and said drain, all of said spaced metal islands in said channel each having an aspect ratio of no greater than 100.

20. The field effect transistor according to claim 19, wherein substantially all of said spaced metal islands in said channel each have an aspect ratio of no greater than 50.

21. The field-effect transistor according to claim 19, wherein said channel includes a deposited layer of a second semiconducting material, said deposited layer not containing any metallic islands.

22. The field-effect transistor according to claim 21, wherein said deposited layer is deposited prior to formation of said percolation-network layer.

23. The field-effect transistor according to claim 19, wherein said percolation-network layer comprises a plurality of discrete metal particles being said spaced metallic islands, said plurality of discrete metal particles being at least partially submerged in said first semiconducting material.

24. The field-effect transistor according to claim 23, wherein ones of said plurality of discrete metal particles contact said gate-insulator layer.

25. The field-effect transistor according to claim 19, wherein said spaced metallic islands are remnants of a continuous metallic film that was subjected to an impulse that formed said remnants.

26. The field-effect transistor according to claim 19, wherein said spaced metallic islands are spaced film islands formed by Volmer-Weber island growth stopped prior to ones of said spaced film islands merge into a continuous film.

27. The field-effect transistor according to claim 19, wherein said spaced metallic islands are arranged in a predetermined pattern.

28. The field-effect transistor according to claim 19, wherein said spaced metallic islands were formed by deposition and patterning techniques.

29. The field-effect transistor according to claim 19, wherein said spaced metallic islands are arranged in a random pattern.

30. The field-effect transistor according to claim 19, wherein said percolation-network layer includes a plurality of composite particles comprising corresponding respective metal cores and corresponding respective semiconducting shells, said spaced metallic islands being said metal cores and said second semiconducting material comprising at least said semiconducting shells.

31. The field-effect transistor according to claim 30, wherein said percolation-network layer further includes a deposited semiconducting material substantially encasing said plurality of composite particles.

32. The field-effect transistor according to claim 19, wherein said spaced metallic islands are distributed among two or more sublayers within said percolation-network layer.

33. The field-effect transistor according to claim 19, wherein a semiconductor/gate-insulator interface is formed between said channel and said gate-insulator layer, and said percolating network is spaced from said semiconductor/gate-insulator interface by no more than 20 nanometers.

* * * * *